(12) United States Patent
Yamamoto (10) Patent No.: US 8,134,400 B2
(45) Date of Patent: Mar. 13, 2012

(54) SEMICONDUCTOR CIRCUIT

(75) Inventor: Masahiro Yamamoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/828,816

(22) Filed: Jul. 1, 2010

(65) Prior Publication Data
US 2011/0074485 A1    Mar. 31, 2011

(30) Foreign Application Priority Data
Sep. 29, 2009 (JP) ................................ 2009-224437

(51) Int. Cl.
*H03L 5/00* (2006.01)
(52) U.S. Cl. ............................ 327/333; 326/62; 326/81
(58) Field of Classification Search .............. 326/62–63, 326/80–82; 327/306, 333
See application file for complete search history.

(56) References Cited

U.S. PATENT DOCUMENTS

| | | | |
|---|---|---|---|
| 6,326,831 B1 | 12/2001 | Kumagai | |
| 6,501,321 B2 * | 12/2002 | Kumagai | 327/333 |
| 6,646,469 B2 * | 11/2003 | Yushan | 326/83 |
| 6,664,822 B2 * | 12/2003 | Watabe | 327/108 |
| 7,495,482 B2 * | 2/2009 | Sakai et al. | 327/108 |
| 7,679,944 B2 * | 3/2010 | Sakurai | 363/98 |
| 2009/0256619 A1 * | 10/2009 | Hsu | 327/379 |

FOREIGN PATENT DOCUMENTS

JP    2000-252809    9/2000

* cited by examiner

*Primary Examiner* — Dinh T. Le
(74) *Attorney, Agent, or Firm* — Oblon, Spivak, McClelland, Maier & Neustadt, L.L.P.

(57) ABSTRACT

A semiconductor circuit is provided in which no error signal is generated even when the circuit is exposed to a transient voltage noise that occurs with a transition from a first state indicating a conduction of a high-potential side switching device to a second state indicating a non-conduction of the high potential side switching device, or vice versa. A high potential switching device drive circuit 1 includes short circuit devices 31 and 32 that are controlled by the second level shifted signals S6 and S7 simultaneously generated across the second load resistances 30 and 29, respectively, to thereby serving to prevent a signal from being generated at one of the output sections where the other one of the first level shifted signals S4 and S5 is to be generated, when either one of the first shifted signals S4 and S5 in level shift circuit ON and OFF sections is generated across first load resistance 28 or 27 in a level shift circuit 2.

16 Claims, 6 Drawing Sheets

SEMICONDUCTOR CIRCUIT

FIELD OF THE INVENTION

The present invention relates to semiconductor circuits, and particularly to a switching device drive circuit for driving and controlling a semiconductor switching device in which a potential different from a common potential serves as a reference potential.

BACKGROUND OF THE INVENTION

In recent years in an application circuit such as a PWM inverter, a synchronous commutation down-converter, and a class-D amplifier, a level shift circuit, by means of a high-voltage integrated circuit, has been used as a circuit for driving a high potential side switching device in two switching devices connected in series between high and low potentials.

A level shift circuit of this kind has a configuration such that, in order to reduce power consumption, only when signal switching occurs between externally supplied command signals that are used to render a semiconductor switching device on the high potential side conductive or non-conductive, a short ON or OFF pulse on the order of a few hundreds of nanoseconds is generated and the generated pulse is transmitted to the switching device drive circuit on the high potential side, where a latch circuit latches the switching device in its ON or OFF state.

In such a level shift circuit, a VS potential, which is a reference voltage of the high potential side switching device, varies with a conduction/non-conduction of the switching device, resulting in application of a greater voltage variation dV/dt to the level shift circuit. This causes in some cases an unintended ON/OFF pulse (error pulse). In this regards, there exists a level shift circuit that includes a signal disabling circuit that prevents generation of the error pulse so that the high potential side switching device may not malfunction even in such cases (refer, for instance, to Japanese Unexamined Patent Application Publication 2000-252809, which is hereinafter called Patent document 1).

In the signal disabling circuit disclosed in Patent document 1, an output signal from an ON pulse section in the level shift circuit, is masked by an output signal from an OFF pulse section in the level shift circuit, while the output signal from the OFF pulse section in the level shift circuit is in turn masked by the output signal from the ON pulse section in the level shift circuit. Because the error pulses due to the application of the variation dV/dt occur basically simultaneously on both ON and OFF pulse sections in the level shift circuit, such a circuit configuration makes it possible to discriminate between a normal signal and an error signal to thereby nullify the error signal only.

However, because of variation in logic threshold values and/or load resistances within the level shift circuit, and because of the influence of wiring impedance, the error pulses—which would normally occur simultaneously on both ON and OFF pulse sections in the level shift circuit—are in some situations generated with some phase difference.

To this end, in Patent document 1, a level shift circuit is disclosed which, by fully masking a pulse width of the normal signal using that of a masking signal, does not malfunction even though error pulses with the phase difference are generated.

However, there is a problem to be overcome in the level shift circuit according to Patent document 1 described above, as will be described below.

In order for the masking pulse width to fully mask the pulse width of the normal signal, a threshold value of a NOT circuit for masking needs to be made smaller than that of the normal signal. This difference between the threshold values represents the difference between the pulse width of the normal signal and that for the masking. Thus, the difference between both widths is preferably made greater in order to achieve reliable masking. The NOT circuit generally uses an N-MOS transistor and a P-MOS transistor that are connected in series together, and a ratio of both transistor sizes is adjusted in order to obtain a desired threshold value.

However, if the threshold value is to be reduced without impairing drive capability of the masking NOT circuit, then the size of the P-MOS transistor needs to be increased. For that reason, the threshold value of the masking NOT circuit cannot be made much smaller because of area constraints of the IC chip, thus imposing a limit on the capability of removing the error pulses with the phase difference.

Further, while it is disclosed that a comparator with a different reference voltage is used in place of the NOT circuit, and that different delay circuits are applied individually to the normal signal and the masking signal to thereby reduce or increase the pulse width, a problem is created in that any of these disclosed techniques makes the total circuit more complex, thus resulting in an increased IC chip size.

SUMMARY OF INVENTION

The present invention is directed to overcome the above problem, and an object thereof is to provide a semiconductor circuit that ensures prevention of a malfunction due to application of a voltage variation dV/dt, using a simple configuration of the circuit.

A semiconductor circuit according to the present invention having a first potential as a common potential and a second potential as a reference potential, the first potential being different from the second potential, for driving and controlling a semiconductor switching device that is driven with the second potential, the semiconductor circuit comprises a level shift circuit having a couple of output sections, for outputting through each output section a main command signal including a pulse-shaped ON command signal or a pulse-shaped OFF command signal relative to the second potential as the reference potential, in response to an input of an activation signal including a pulse-shaped ON signal or a pulse-shaped OFF signal that is relative to the first potential as a reference potential and that renders the semiconductor switching device into a conductive state or a non-conductive state; a latch circuit that outputs a signal, in response to the main command signal, for maintaining the semiconductor switching device in its conductive or non-conductive state; and a level shift signal suppressor that serves, when a signal is generated at either one of the output sections of the level shift circuit, to prevent a signal from being generated at the other output section.

The semiconductor circuit according to the present invention serves, when a signal is generated at either one of the output sections for outputting an ON signal and an OFF signal (hereinafter called "level shift circuit ON section" and "level shift circuit OFF section") in the level shift circuit, to prevent a signal from being generated at the other output section. Thus, no error signal is theoretically generated even when the semiconductor circuit is exposed to a transient voltage noise, and furthermore no error signal is generated even when there is a variation in circuit coefficient between the level shift circuit ON and OFF sections, which ensures suppression of a malfunction of the semiconductor circuit. Further, the foregoing function is achieved by a simple circuit, thus preventing an increased IC chip size. These and other features, advantages and objects of the present invention will be further understood and appreciated by those skilled in the art by reference to the following drawings.

DESCRIPTION OF THE PREFERRED EMBODIMENTS

Embodiment 1

Figure 1:
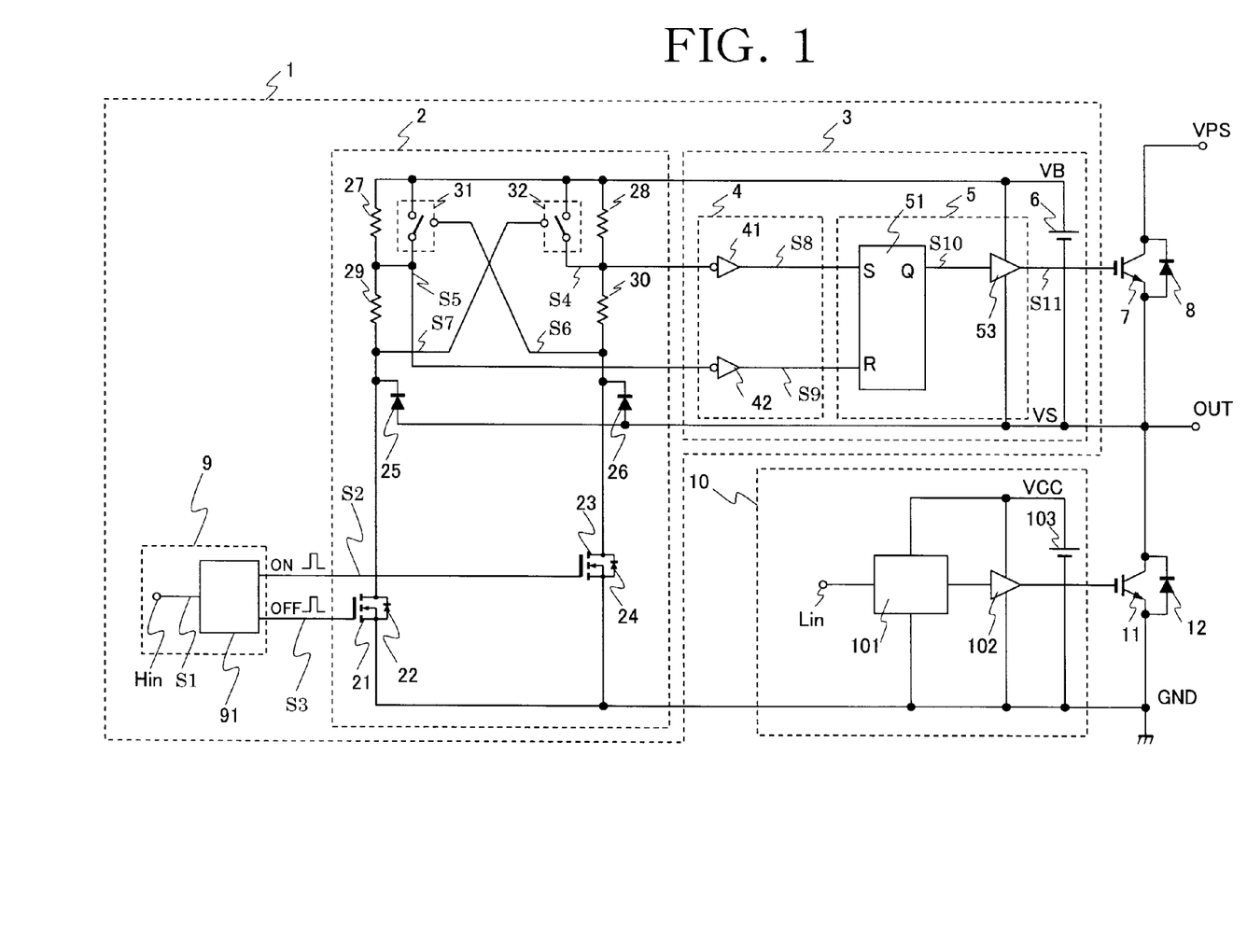
FIG. 1 is a circuit diagram illustrating a configuration of Embodiment 1 according to the present invention.

FIG. 1 shows an embodiment of a semiconductor circuit according to the present invention. Referring to FIG. 1, semiconductor switching devices 7 and 11, such as IGBTs, are connected in series between a main power source potential GND acting as a first potential or the common potential, and a main power source potential VPS of a high potential, which configures a half-bridge inverter circuit. In addition, flyback (or freewheeling) diodes 8 and 12 are connected in inverse parallel with the semiconductor switching devices 7 and 11, respectively, and a load, not shown, is to be connected to a junction—i.e., a terminal OUT—between the semiconductor switching devices 7 and 11.

Referring to FIG. 1, the semiconductor switching device 7 is called a high potential side switching device because it performs switching operation between a potential at the terminal OUT—the second potential—serving as a reference potential and the main power source VPS of the high potential.

Further, a semiconductor switching device 11 is called a low potential side switching device because it performs switching operation between a main power source potential GND serving as the reference potential and the potential at the terminal OUT.

Thus, a switching device drive circuit shown in FIG. 1 is separated into a switching device drive circuit 1 on the high potential side and a switching device drive circuit 10 on the low potential side.

Moreover, the high potential side switching device drive circuit 1 is classified into a low potential circuit section 9 in which the main power source potential GND of the low potential serves as the reference potential a high potential circuit section 3 in which the terminal OUT of the switching device serves as the reference potential, and a floating power source 6 having its negative electrode connected to this reference potential serves as a power source, and a level shift circuit 2 that transmits a signal from the low potential circuit section 9 to the high potential circuit section 3.

An input signal S1 that is provided from an external microprocessor or the like and that serves as a command to render the high potential side switching device conductive or non-conductive is applied to an input terminal Hin of the low potential circuit section 9. The input signal S1 is generally a digital value having a high (H) level or a low (L) level that is generated relative to the GND serving as a reference potential. In an example of the present invention, the H level corresponds to a conduction command, and the L level to a non-conduction command. The input signal S1 is input to a pulse generation circuit 91 from which an ON pulse signal S2 and an OFF pulse signal S3 are generated. The signal S2 is a pulse-shaped ON signal generated in response to a rise of the input signal S1, while the signal S3 is a pulse-shaped OFF signal generated in response to a fall of the input signal S1. The ON pulse signal S2 and the OFF pulse signal S3 is collectively called activation signals.

Next, a configuration of a level shift circuit that receives the ON and OFF pulse signals S2 and S3 will be described below. The ON pulse signal S2 is input to a gate of an ON pulse HNMOS transistor 23 that is a first high voltage semiconductor device, to drive the HNMOS transistor 23. Likewise, the OFF pulse signal S3 is input to a gate of an OFF pulse HNMOS transistor 21 that is a second high voltage semiconductor device, to drive the HNMOS transistor 21.

One ends of first load resistances 27 and 28 are connected to a positive electrode (VB potential) of the high potential side floating power source 6. Further, the other ends of the first load resistances 27 and 28 are connected to one ends of second load resistances 29 and 30 and also to input ends of inverse logic devices 41 and 42, respectively.

Switches 31 and 32 serving as short-circuit devices are further connected in parallel with the first load resistances 27 and 28, respectively. The short circuit device functions as a level shift signal suppressor. Each of the switches 31 and 32 has a control terminal. Upon application of a low level signal to the control terminal, a low impedance path (short circuit path) is established between the main electrodes, while upon application of a high level signal thereto, a high impedance path (open path) is established therebetween.

The other ends of the second load resistances 29 and 30 are connected to drains of the HNMOS transistors 21 and 23, respectively. Further, a junction between the second load resistance 30 and the drain of the HNMOS transistor 23, both of which constitute the level shift circuit ON section, is connected to the switch 31 that is the short circuit device in the level shift circuit OFF section. Likewise, a junction between the second load resistance 29 and the drain of the HNMOS transistor 21, both of which configure the level shift circuit OFF section, is connected to the switch 32 that is the short circuit device in the level shift circuit ON section.

In addition, the negative electrode (VS potential) of the high potential side floating power source 6 is connected to anodes of diodes 25 and 26 whose cathodes are connected to drains of the HNMOS transistor 21 and 23, respectively.

With this configuration, the HNMOS transistors 23 and 21 come into conduction in response to the ON pulse signal S2 and the OFF pulse signal S3, respectively, thereby causing pulse-shaped voltage drops to occur across the first load resistances 28 and 27, which produces first level shifted signals S4 and S5, respectively.

Further, the pulse-shaped voltage drops also occur simultaneously across the second load resistances 30 and 29 connected in series to the first load resistances 28 and 27, which provides second level shifted signals S6 and S7 that are input, as described previously, to the control terminals of the switches 31 and 32, respectively.

Next, the configuration of the high potential circuit section 3 that receives the first level shifted signals S4 and S5, will be described below. The first inverse logic device 41, which receives a first level shifted signal S4 from the level shift circuit ON section, issues a pulse-shaped ON command signal S8. Likewise, the second inverse logic device 42, which receives a first level shifted signal S5 from the level shift circuit OFF section, issues a pulse-shaped OFF command signal S9. The ON and OFF command signals S8 and S9 are collectively called main command signals.

The ON command signal S8 and the OFF command signal S9 are input to a set terminal and a reset terminal of a SR latch 51, respectively, thereby switches the high potential side switching device 7 between its conductive and non-conductive states in response to the pulse-shaped main command signals, with the state altered being retained. An output signal S10 from a Q output of the SR latch 51 is supplied to an input terminal of a buffer amplifier 53 that amplifies the current to a level sufficient to drive the high potential side switching device 7.

Preferably, logic threshold values of the switches 31 and 32 serving as the short circuit devices are set to be the same. Further, it is preferable that logic threshold values of the first and second inverse logic devices 41 and 42 be set to be the same. Moreover, the logic threshold values of the switches 31 and 32 are preferably set to be smaller than those of the first inverse logic device 41 and the second inverse logic device 42.

The low potential side switching device drive circuit 10 is a circuit that uses a low potential side power source 103 as a power source, to drive the low potential side switching device 11. After a drive signal applied externally to an input terminal Lin has been delayed by a delay circuit 101 so that its delay time is made substantially the same as a transmission delay time in the high potential side switching device drive circuit 1, the delayed drive signal is current-amplified by a buffer amplifier 102 to a level sufficient to drive the low potential side switching device 11.

Next, the operation of the high potential side switching device drive circuit 1 according to Embodiment 1 will be described with reference to a timing chart shown in FIG. 2.

In this case, as with the description of the conventional art, the description is provided for the case where the high potential side switching device 7 comes into conduction—i.e., a conduction command using the externally supplied input signal S1 is input at a time of t0. The individual operation will be described in a chronological order. Here, it is apparent from symmetry of circuit that the same holds true also for the case where the high potential side switching device 7 becomes non-conductive.

Times t0-t5:
Here, as described previously, the high level of the externally supplied input signal S1 means to function as a conduction command to render the high potential side switching device 7 conductive, and the low level of the input signal S1 means to function as a non-conduction command to render the high potential side switching device 7 non-conductive.

In synchronization with the rise of the input signal S1, a single positive pulse serving as the ON pulse signal S2 is output from the pulse generation circuit 91 (times t0 to t3). In the level shift circuit 2 that has received the ON pulse signal S2, a voltage drop occurs across the first load resistance 28 in the level shift circuit ON section, which provides a single negative pulse serving as the first level shifted signal S4 in the level shift circuit ON section.

Further, the first inverse logic device 41 that receives the first level shifted signal S4 in the level shift circuit ON section generates a positive pulse serving as the ON command signal S8. Assuming that the logic threshold value of the first inverse logic device 41 is Vth1, a generation period of time T2 of this pulse corresponds to a period where the first level shifted signal S4 in the level shift circuit ON section falls below the value of Vth1—i.e., times t2-t4.

Simultaneously, the voltage drop also occurs across the second load resistance 30 in the level shift circuit ON section, which also provides a single negative pulse serving as the second level shifted signal S6 in the level shift circuit ON section. This causes a short circuit of the switch 31 that is the short circuit device in the level shift circuit OFF section, thereby in turn causing the first level shifted signal S5 to stay in the high level—that is, a level shift operation in the level shift circuit OFF section is suppressed.

Since an amount of current flowing through the main electrodes of the switch 31 in a short circuit state is limited by the second load resistance 29 in the level shift circuit OFF section, an excessive amount of current that may cause damages to the semiconductor circuit will not flow.

Here, assuming that the logic threshold value of the control terminal of the switch 31 is Vth2, a period of time T1 during which the switch 31 is being short-circuited corresponds to a period of time in which the second level shifted signal S6 in the level shift circuit ON section falls below the Vth2—that is, times t1 to t5.

The second level shifted signal S6 in the level shift circuit ON section is a sum of the amounts of voltage drops across the first and the second load resistances 28 and 30 in the level shift circuit ON section, so that the second level shifted signal S6 has a larger amount of voltage variation per unit time than the first level shifted signal S4.

Thus, a period of time during which the switch 31 is being short-circuited—that is, the period of time T1 in which the level shift operation in the level shift circuit OFF section is suppressed—fully masks the period of time T2 in which the ON command signal S8 is valid.

Moreover, if the logic threshold value of the control terminal of the switch 31 is assumed to be Vth2 and set to be smaller than the logic threshold value Vth1 of the first inverse logic device 41, then a further difference develops between both the periods of time, thus providing an advantage in masking with more reliability.

Finally, since only the ON command signal S8 serving as the set signal is input to the SR latch circuit 51 and the OFF command signal S9 serving as the reset signal is not input thereto, the Q output S10 is latched high to drive the high potential side switching device 7, through the buffer amplifier 53, into the conductive state.

Times t6 to t11:
Next, the operation will be described occurring when a voltage noise appears with transient voltage variations of the VS potential and the VB potential.

The conduction of the high potential side switching device 7 causes the OUT terminal voltage, i.e., the VS potential to rise transiently and also the VB potential to transiently rise via the floating power source 6. This transient potential rise (dV/dt) is applied to parasite diodes 22 and 24 that are inversely biased and inverse-parallel coupled with the HNMOS transistors 21 and 23, respectively. In this case, a displacement current flows through each of the parasite diodes 22 and 24 from its cathode to its anode, which also causes unintended voltage drops (error pulses) across the first and the second load resistances 27, 28, 29 and 30.

Figure 2:
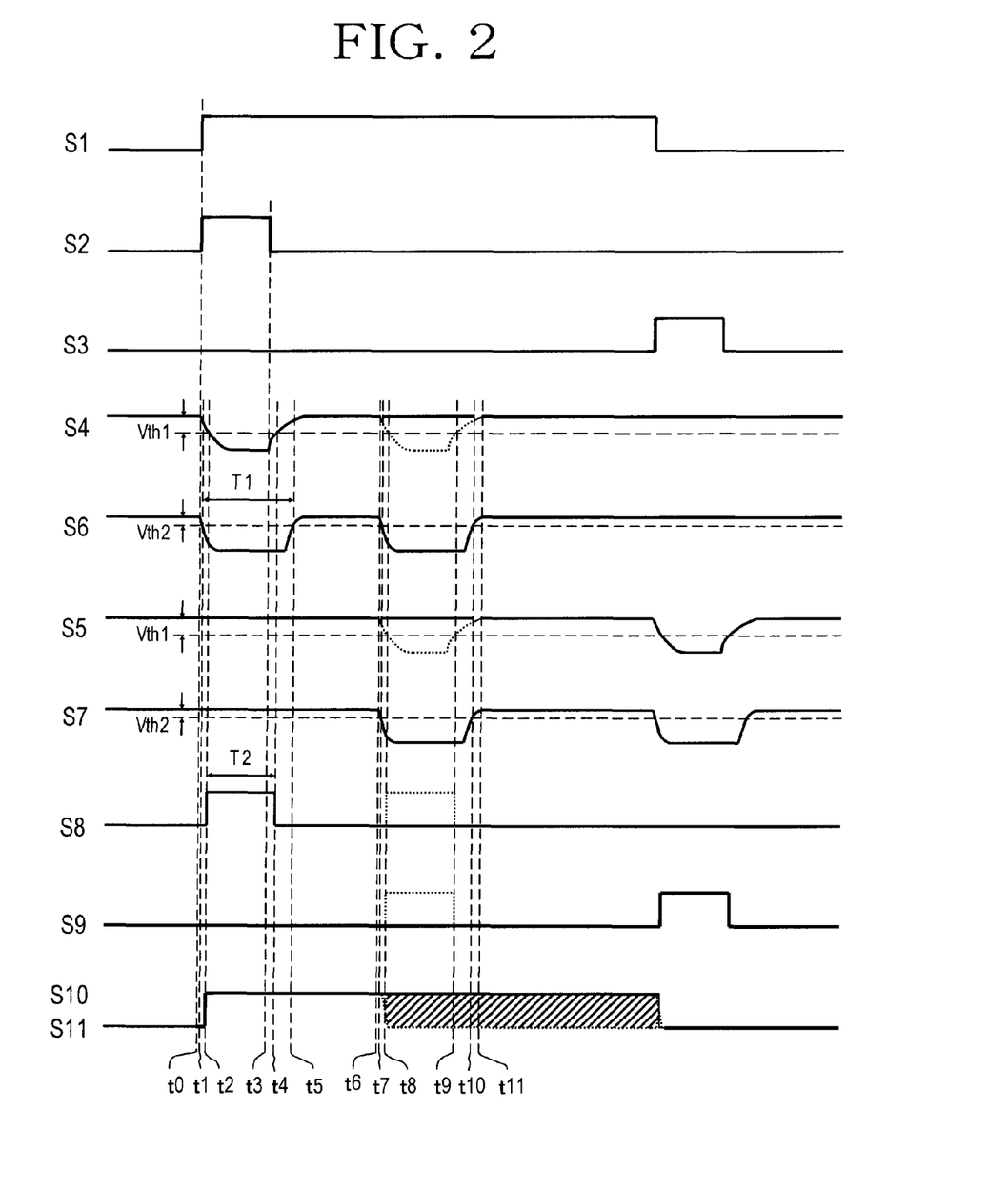
FIG. 2 is a timing chart illustrating an operation of Embodiment 1 according to the present invention.

In FIG. 2, in times t6-t11, the error pulses are shown in the first level shifted signals S4 and S5 by a dotted line waveform. Without the level shift circuit current suppressor of Embodiment 1, these error pulses cause error command signals, shown by the dotted line waveform, to be generated for the ON and OFF command signals S8 and S9. The presence of these error command signals signifies that the set signal and the reset signals are input simultaneously into the SR latch 51, which is a forbidden state for the latch, thus resulting in the Q output S10 from the SR latch 51 being unstable. In particular, it is significantly unstable when the error pulses have some of phase difference due to a variation in circuit constant.

However, since the level shift signal suppressor described in Embodiment 1 according to the invention causes the short circuit devices in the level shift circuit ON and OFF sections—i.e., the switches 31 and 32—to be short-circuited, both of the first level shifted signals S4 and S5 in the level shift circuit ON and OFF sections are not eventually generated as valid signals, thereby avoiding the above-described unstable state.

In brief periods of time between t6 and t7, and t10 and t11, where the second level shifted signals S6 and S7 are above the logic threshold values of the switches 31 and 32, respectively, pulses with extremely low amplitude are generated for the first level shifted signals S4 and S5. However, these extremely low pulses are filtered out by setting sufficiently large logic threshold values for the first and second inverse logic devices 41 and 42, thus posing no problem.

Further, as described previously, the period during which the switches 31 and 32 are short-circuited are set to be longer than that of possible error pulses and to fully mask the error pulses, and thus the error pulse having the phase difference is also effectively prevented from being generated.

In the period of time during which the displacement current flows, the short circuit current flowing through the switches 31 and 32 flows through the second load resistances 29 and 30 across which a voltage drop occurs. Thus, the second level shifted signals S7 and S6 are valid, causing the switches 31 and 32 to remain closed. If application of the voltage variation dV/dt is stopped which causes the generation of the displacement current, then the displacement current will not flow and thus the voltage drops across the second load resistances 29 and 30 will not occur, thereby causing the switches 31 and 32 to open, which returns the circuit to a state allowing the level shift operation again.

Embodiment 2

Figure 3:
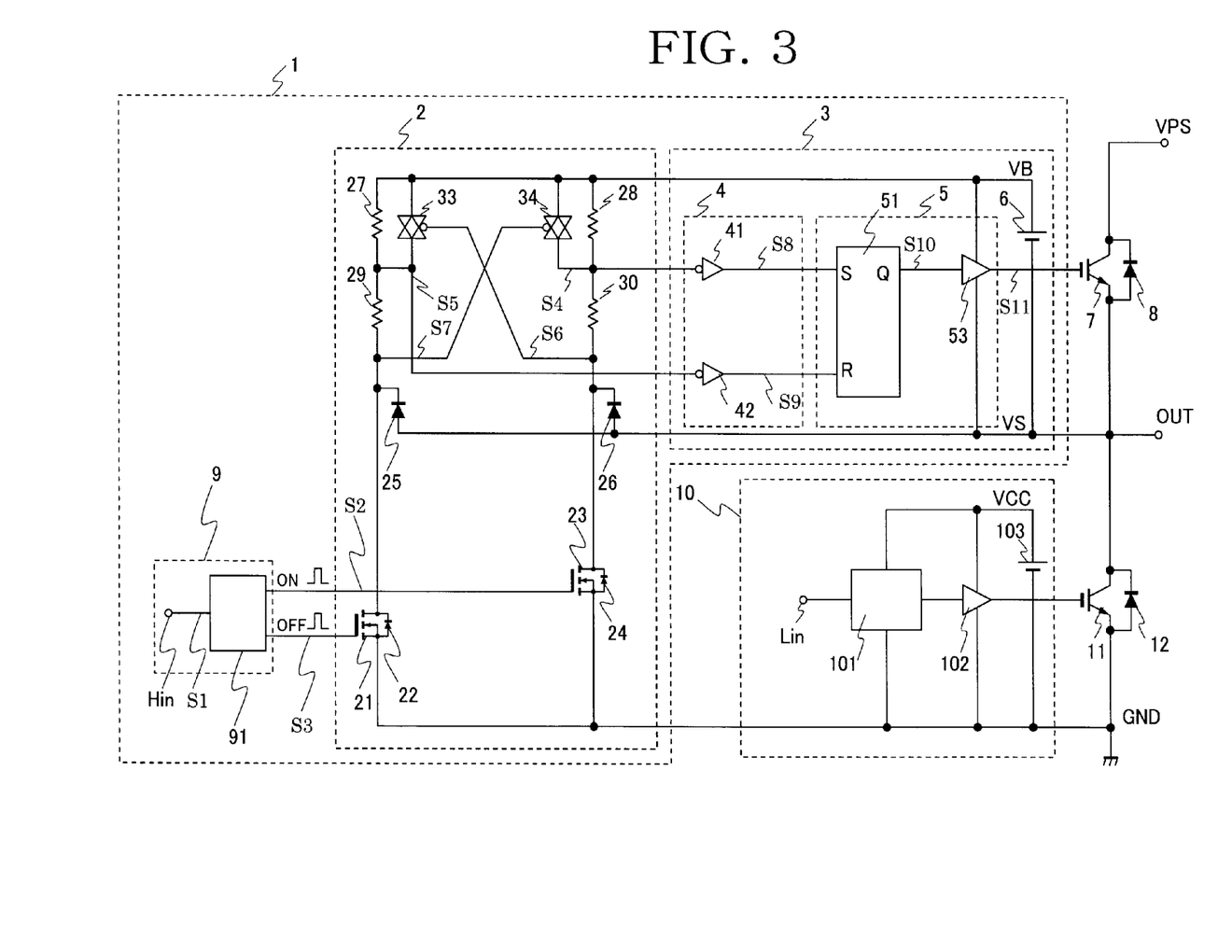
FIG. 3 is a circuit diagram illustrating a configuration of Embodiment 2 according to the present invention.

FIG. 3 shows a semiconductor circuit according to Embodiment 2 of the present invention. Components and signals that are the same as those in Embodiment 1 hereinafter bear the same reference numerals, and their description is not provided.

In the present embodiment, analog switches 33 and 34 are employed as a specific example of the switch serving as the short circuit device described in Embodiment 1. This enables speedy and accurate control of the short circuit and open circuit.

Embodiment 3

Figure 4:
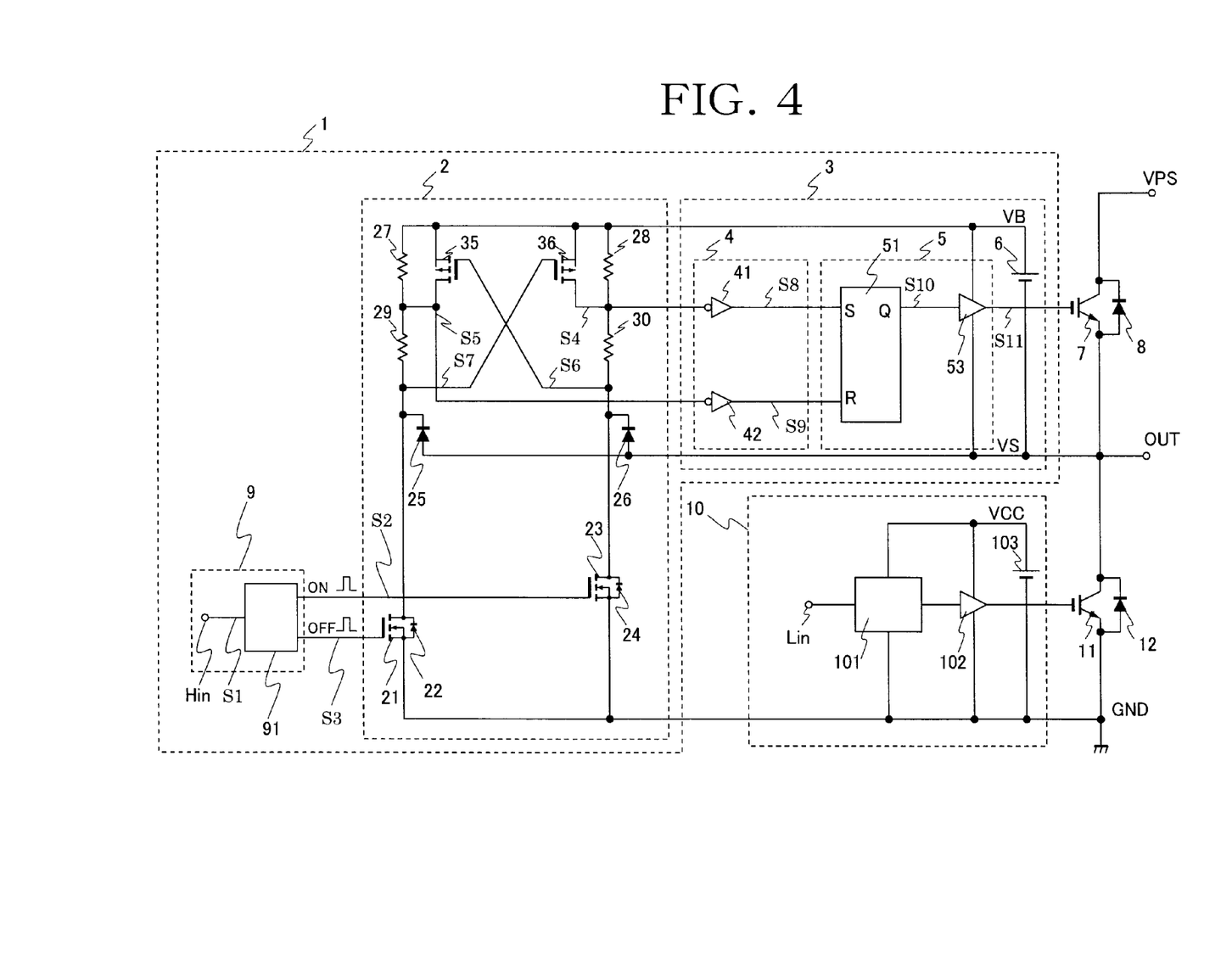
FIG. 4 is a circuit diagram illustrating a configuration of Embodiment 3 according to the present invention.

FIG. 4 shows a semiconductor circuit according to Embodiment 3 of the present invention. In the present embodiment, Pch MOS transistors 35 and 36 are used as a specific example of the switch serving as the short circuit device described in Embodiment 1. The use of the Pch MOS transistors configurable by a standard CMOS process enables prevention of an increase in chip size of the semiconductor circuit. Further, since the threshold value of the Pch MOS transistor is about one volt in a typical example, it is possible to easily implement an embodiment circuit, described to be preferable in Embodiment 1, in which the logic threshold values of the short circuit devices are set to be smaller than those of the first and second inverse logic devices 41 and 42.

Embodiment 4

Figure 5:
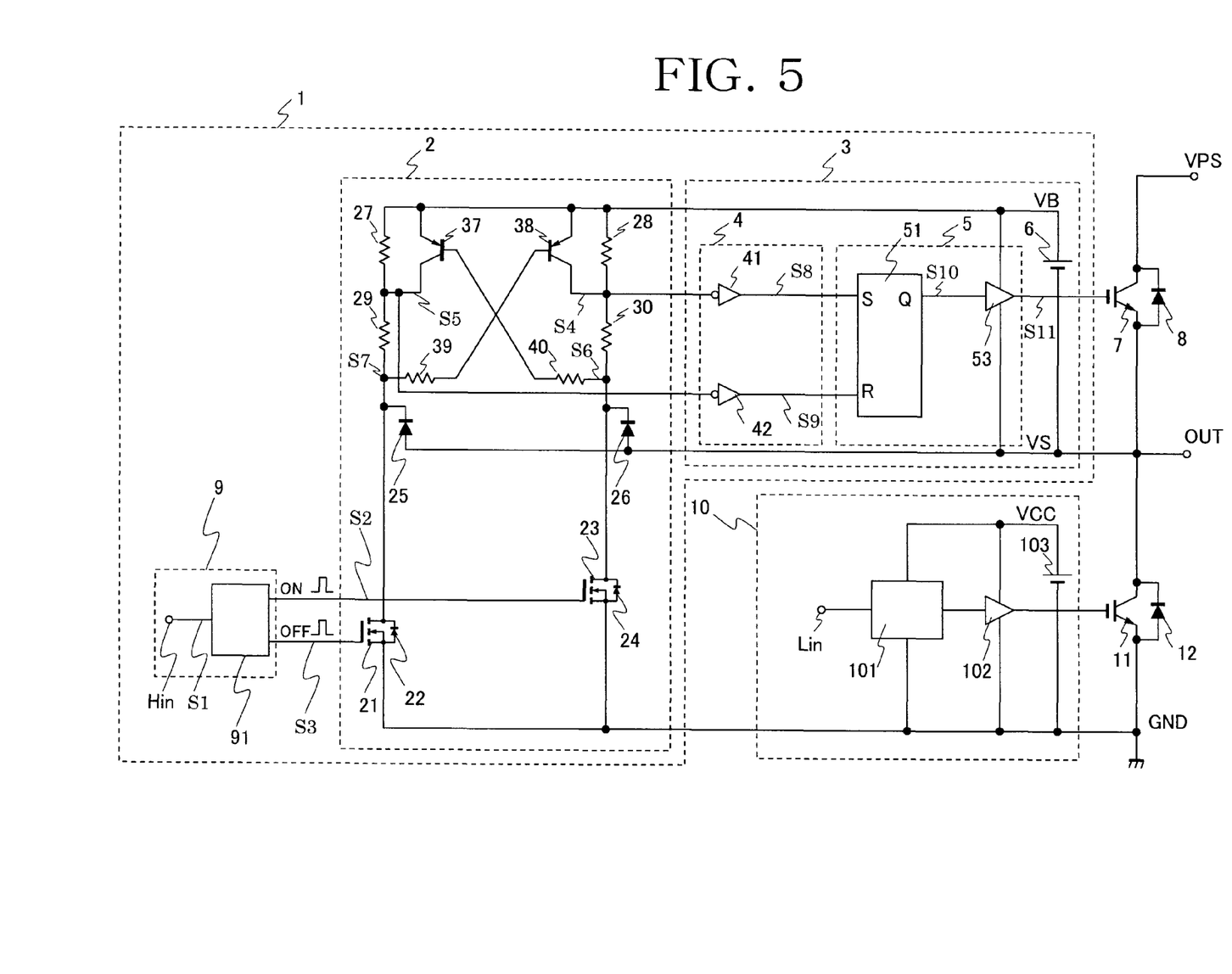
FIG. 5 is a circuit diagram illustrating a configuration of Embodiment 4 according to the present invention.

FIG. 5 shows a semiconductor circuit according to Embodiment 4 of the present invention. In the present embodiment, PNP bipolar transistors 37 and 38 are used as a specific example of the switch serving as the short circuit device described in Embodiment 1. Since the bipolar transistors each are a current drive device, the second level shifted signals S6 and S7 are applied to the bipolar transistors, via base resistances 39 and 40 serving as current biasing devices, respectively. The bipolar transistor has a good accuracy of its ON voltage, which thus provides greater freedom in circuit design. This can reduce the size of the semiconductor circuit in its entirety, thus enabling prevention of an increase in semiconductor chip size. Further, since the threshold value of the bipolar transistor is about 0.6 to 0.7 volt in a typical example, it is possible to easily implement an embodiment circuit, described to be preferable in Embodiment 1, in which the logic threshold value of the short circuit device are set to be smaller than those of the first and second inverse logic devices 41 and 42.

Embodiment 5

Figure 6:
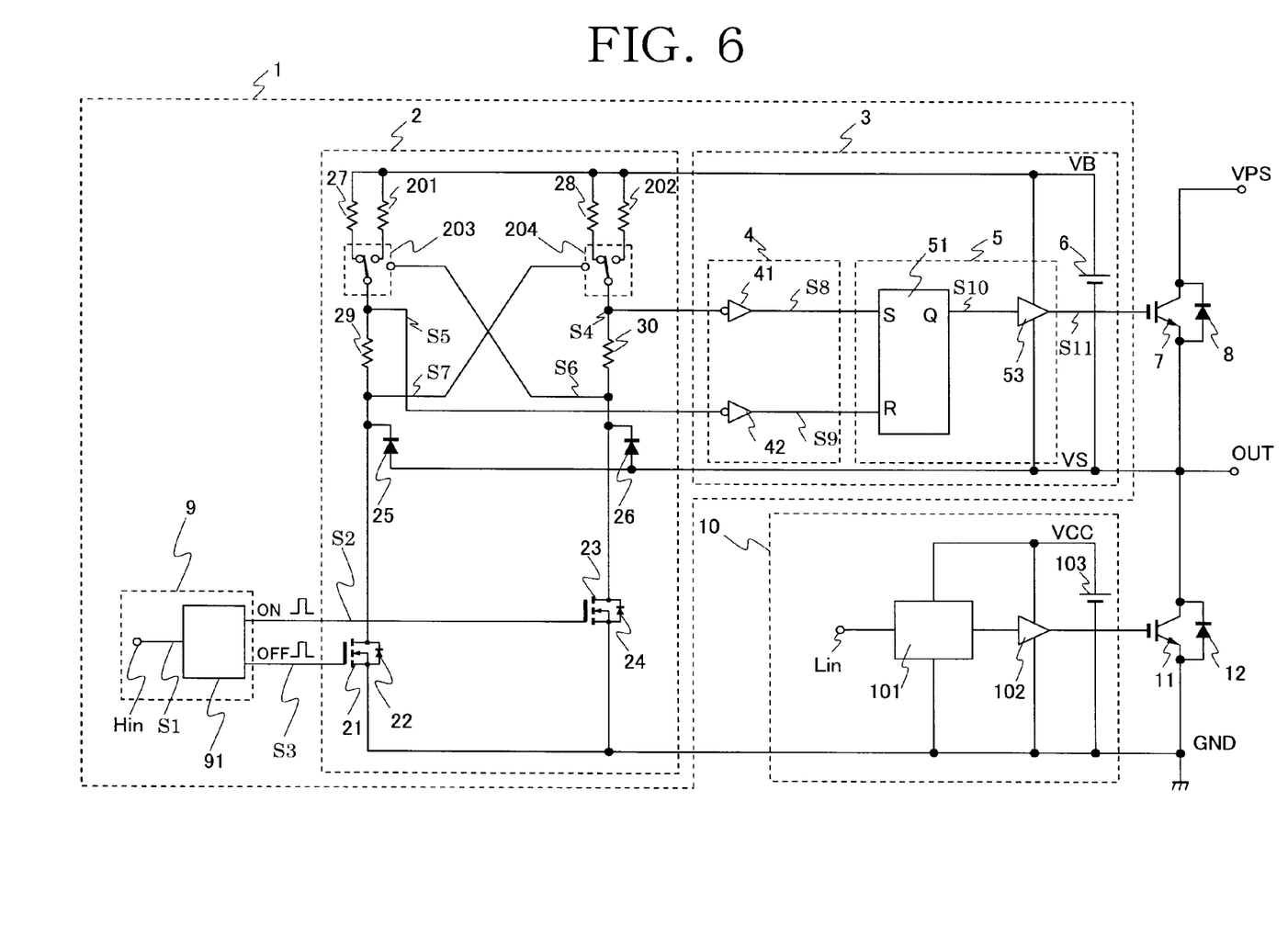
FIG. 6 is a circuit diagram illustrating a configuration of Embodiment 5 according to the present invention.

FIG. 6 shows a semiconductor device according to Embodiment 5 of the present invention. In the present embodiment, the level shift circuit 2 also includes third load resistances 201 and 202, one ends of which are connected to the VB potential, and double-throw analog switch 203 and 204 serving as current path switching devices.

The common terminals of the double-throw analog switches 203 and 204 are connected to one ends of the second load resistances 29 and 30, respectively, while the other two terminals of the analog switches (a normally closed terminal and a normally open terminal) are connected to other ends of the first load resistances 27 and 28 and to those of the third load resistances 201 and 202, respectively. In addition, the double-throw control terminals of the switches 203 and 204, which are of negative polarity, receive the second level shifted signals S7 and S6, respectively.

Preferably, the double-throw analog switches 203 and 204 are of so called "make-before-break" operation—which does not place their common terminals in open circuit state during the switching operation.

The resistive values of the load resistance 201 and 202 are set to be smaller than those of the first load resistances 27 and 28, respectively. More specifically, it will generally suffice if the voltage drops occurring across the third load resistances 201 and 202 are substantially smaller than the logic threshold values of the second inverse logic devices 41 and 42.

In the present embodiment, the suppression of the level shift operation is achieved not by short-circuiting current paths across the first load resistances 27 and 28 as shown in Embodiment 1 through Embodiment 4, but by switching the current path from the first load resistances 27 and 28 to the third load resistances 201 and 203 with a smaller resistive value.

This configuration causes a current to flow via the third resistances 201 and 202 when the level shift operation is suppressed, thus enabling reduction of the current consumption.

While, as described above, various embodiments according to the invention are shown, the invention is not limited to these and a variety of modifications or alterations can be made. For example, signal polarities described in the respective embodiments are each just an example. As long as the logic operation is performed similarly, another logic circuit in which various kinds of logic minimization and its logic implementation are made in accordance with De Morgan's law, or a circuit with different High active and Low active signals may also be included within the semiconductor circuit of the invention. Further, while in the embodiments according to the invention, the level shift circuit is described where a signal is transmitted from a low potential side of the circuit to a high potential side thereof, those skilled in the art can also easily devise another embodiment that utilizes a level shift circuit in which the signal is transmitted conversely from the low potential to the high potential. Thus, this circuit is included within the scope of the invention. It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. A semiconductor circuit having a first potential as a first reference potential and a second potential as a second reference potential, the first potential being different from the second potential, for driving and controlling a semiconductor switching device that is driven with the second potential, the semiconductor circuit comprising:

a level shift circuit having an input section coupled to a plurality of output sections at a first node and a second node to output through each output section a main command signal including one of a pulse-shaped ON command signal and a pulse-shaped OFF command signal relative to the second potential as the second reference potential, in response to an input of an activation signal including one of a pulse-shaped ON signal and a pulse-shaped OFF signal relative to the first potential as the first reference potential and that renders the semiconductor switching device into one of a conductive state and a non-conductive state; and a latch circuit that outputs a maintaining signal, in response to the main command signals output by the level shift circuit, to maintain the semiconductor switching device in one of the conductive state and the non-conductive state, wherein each output section is coupled between a third potential and one respective node of the nodes, and includes a level shift signal suppressor that, when one of the pulse-shaped ON command signal and the phase-shaped OFF command signal is generated at a first one of the plurality of output sections of the level shift circuit, prevents the other one of the pulse-shaped ON command signal and the pulse-shaped OFF command signal from being generated at a second one of the plurality of output sections, the level shift signal suppressors including a first switch having a first terminal, a second terminal, and a third terminal, and a second switch having a fourth terminal, a fifth terminal, and a sixth terminal, the first terminal and the fourth terminal being directly connected to the third potential, and the third terminal and the sixth terminal being directly connected to the respective node of the nodes, and wherein the level shift suppressors further include a first resistive element having a first end directly connected to the fifth terminal of the second switch and a second end directly connected to the third terminal of the first switch, and a second resistive element having a third end directly connected to the second terminal of the first switch and a fourth end directly connected to the sixth terminal of the second switch.

2. The semiconductor circuit of claim 1, wherein the level shift circuit simultaneously generates at each of the plurality of output sections, in response to the activation signal inputted thereto, first and second level shifted signals resulted from different voltage drops across a plurality of resistive elements including the first resistive element and the second resistive element;

wherein the main command signal is a waveform modified signal derived from the first level shifted signal resulted from a smaller voltage drop than the second level shifted signal; and wherein the level shift signal suppressor prevents the first level shifted signal from being generated at one of the plurality of output sections, in response to the second level shifted signal resulted from a larger voltage drop than the first level shifted signal.

3. The semiconductor circuit of claim 2, wherein the level shift circuit comprises, in each output section:

a first load resistance of the plurality of resistive elements that provides the first level shifted signal, a second load resistance of the plurality of resistive elements, the second load resistance being one of the first resistive element and the second resistive element, connected in series with the first load resistance and provides the second level shifted signal; and a high-voltage semiconductor device including a main terminal connected in series with the second load resistance, by which an electrical conduction between the main terminal and a reference terminal is established in response to the activation signal supplied to a control terminal of the semiconductor device, wherein the level shift signal suppressor includes a short circuit device, the short circuit device being one of the first switch and the second switch, in one output section that short-circuits both terminals of the first load resistance through a low impedance path, in response to the second level shifted signal the from other output section.

4. The semiconductor circuit of claim 3, wherein the short circuit device is an analog switch.

5. The semiconductor circuit of claim 3, wherein the short circuit device is a MOS transistor.

6. The semiconductor circuit of claim 4, wherein the short circuit device is a bipolar transistor.

7. The semiconductor circuit of claim 2, wherein the level shift circuit comprises, in each output section;

a first load resistance of the plurality of resistive elements that provides the first level shifted signal;

a second load resistance of the plurality of resistive elements, the second load resistance being one of the first resistive element and the second resistive element, that provides the second level shifted signal;

a third load resistance smaller in resistive value than the first load resistance, the third load resistance being the other of the first resistive element and the second resistive element; and a high-voltage semiconductor device including a main terminal connected in series with the second load resistance, by which an electrical conduction between the main terminal and the reference terminal is established in response to the activation signal supplied to a control terminal of the semiconductor device, wherein the level shift signal suppressor includes a current path switch, the current path switch being one of the first switch and the second switch, in one output section that connects the first load resistance and the second load resistance together while no second level shifted signal is being output from the other output section, and that connects the second load resistance and the third load resistance together while the second level shifted signal from the other output section is being output.

8. The semiconductor circuit of claim 7, wherein the current path switch is a double-throw analog switch including a common terminal connected to the second load resistance and the two other terminals, either of which is electrically connected to the common terminal depending on the second level shifted signal and are connected to the first and the third load resistances, respectively.

9. The semiconductor circuit of claim 1, further comprising:
an inverse logic circuit that receives the main command signal from each of the plurality of output sections of the level shift circuit and outputs a plurality of inverted command signals to the latch circuit based the received main command signal,
wherein the latch circuit outputs the maintaining signal based on the plurality of inverted command signals.

10. The semiconductor circuit of claim 1, further comprising:
a low potential switching device circuit including a power source electrically coupled to a delay circuit, an amplifier, and a low potential switching device, each of the power source, the delay circuit, the amplifier, and the low potential switching device being further electrically coupled to the first potential as the first reference potential,
wherein the low potential switching device circuit drives the low potential switching device based on an input signal received at the delay circuit and amplified by the amplifier to switch between the first potential as the first reference potential and the second potential as the second reference potential.

11. The semiconductor circuit of claim 1, wherein the level shift circuit includes a first transistor that receives the activation signal including the pulse-shaped OFF signal and a second transistor that receives the activation signal including the pulse-shaped ON signal, each of the first transistor and the second transistor being directly electrically coupled to the first potential.

12. A semiconductor circuit comprising:
a pulse generation circuit generating an ON pulse signal or an OFF pulse signal from a first input signal;
a delay circuit receiving a second input signal and outputting a delayed signal, the second input signal having an opposite level of the first input signal;
a first transistor receiving one of the ON pulse signal and the OFF pulse signal;
a second transistor receiving the other signal of the ON pulse signal and the OFF pulse signal that the first transistor receives;
a first short-circuit device having a first control terminal, the first short-circuit device connected in parallel with a first resistance;
a second short-circuit device having a second control terminal, the second short-circuit device connected in parallel with a second resistance;
a third resistance having a first end and a second end, the first end connected to the first resistance and the second end connected to the first transistor;
a fourth resistance having a third end and a fourth end, the third end connected to the second resistance and the fourth end connected to the second transistor;
a first line connecting the first control terminal of the first short-circuit device and the fourth end of the fourth resistance;
a second line connecting the second control terminal of the second short-circuit device and the second end of the third resistance;
a latch having a reset terminal and a set terminal, the reset terminal connected to the first end of the third resistance and the set terminal connected to the third end of the fourth resistance;
a high potential side switching device connected to an output terminal of the latch; and
a low potential side switching device connected in series with the high potential side switching device, the low potential side switching device receiving the delayed signal from the delayed circuit.

13. The semiconductor circuit of claim 12, wherein the first short-circuit device and the second short-circuit device are analog switches.

14. The semiconductor circuit of claim 12, wherein the first short-circuit device and the second short-circuit device are MOS transistors.

15. The semiconductor circuit of claim 12, wherein the first short-circuit device and the second short-circuit device are bipolar transistors.

16. A semiconductor circuit comprising:
a pulse generation circuit generating an ON pulse signal or an OFF pulse signal from a first input signal;
a delay circuit receiving a second input signal and outputting a delayed signal, the second input signal having an opposite level of the first input signal;
a first transistor receiving one of the ON pulse signal and the OFF pulse signal;
a second transistor receiving the other signal of the ON pulse signal and the OFF pulse signal that the first transistor receives;
a first double-throw analog device having a first control terminal, a first common terminal, a first normally closed terminal and a first normally open terminal;
a second double-throw analog device having a second control terminal, a second common terminal, a second normally closed terminal and a second normally open terminal;
a first resistance connected to the first normally closed terminal of the first double-throw analog device;
a second resistance connected to the first normally open terminal of the first double-throw analog device;
a third resistance connected to the second normally closed terminal of the second double-throw analog device;
a fourth resistance connected to the second normally open terminal of the second double-throw analog device;
a fifth resistance having a first end and a second end, the first end connected to the first common terminal of the first double-throw analog device and the second end connected to the first transistor;
a sixth resistance having a third end and a fourth end, the third end connected to the second common terminal of the second double-throw analog device and the fourth end connected to the second transistor;
a first line connecting the first control terminal of the first double-throw analog device and the fourth end of the sixth resistance;
a second line connecting the second control terminal of the second double-throw analog device and the second end of the fifth resistance;

a latch having a reset terminal and a set terminal, the reset terminal connected to the first end of the fifth resistance and the set terminal connected to the third end of the sixth resistance;

a high potential side switching device connected to the output terminal of the latch; and a low potential side switching device connected in series with the high potential side switching device, the low potential side switching device receiving the delayed signal from the delayed circuit.

* * * * *